(12) United States Patent
Chan et al.

(10) Patent No.: US 8,901,583 B2
(45) Date of Patent: Dec. 2, 2014

(54) SURFACE MOUNT DEVICE THIN PACKAGE

(75) Inventors: Alex Chi Keung Chan, Hong Kong (CN); Charles Chak Hau Pang, Hong Kong (CN); Ruan Fei Fei, Huizhou (CN)

(73) Assignee: Cree Huizhou Opto Limited, Huizhou Municipality, Guangdong Province (CN)

( * ) Notice: Subject to any disclaimer, the term of this patent is extended or adjusted under 35 U.S.C. 154(b) by 666 days.

(21) Appl. No.: 12/758,702

(22) Filed: Apr. 12, 2010

(65) Prior Publication Data
US 2011/0248293 A1 Oct. 13, 2011

(51) Int. Cl.
| | | |
|---|---|---|
| *H01L 33/62* | (2010.01) | |
| *H01L 33/48* | (2010.01) | |
| *H01L 25/075* | (2006.01) | |
| *H01L 33/64* | (2010.01) | |

(52) U.S. Cl.
CPC ........ *H01L 33/62* (2013.01); *H01L 2224/32245* (2013.01); *H01L 2224/48091* (2013.01); *H01L 2224/48247* (2013.01); *H01L 33/486* (2013.01); *H01L 2924/01019* (2013.01); *H01L 2224/73265* (2013.01); *H01L 2924/09701* (2013.01); *H01L 25/0753* (2013.01); *H01L 33/647* (2013.01)
USPC .......... 257/89; 257/88; 257/98; 257/E33.056; 257/E33.066

(58) Field of Classification Search
CPC ........ H01L 33/48; H01L 33/62; H01L 33/486
USPC ....................... 257/88, 89, E33.056, E33.066
See application file for complete search history.

(56) References Cited

U.S. PATENT DOCUMENTS

| | | | |
|---|---|---|---|
| 4,946,547 A | | 8/1990 | Palmour |
| 5,200,022 A | | 4/1993 | Kong |
| 5,266,817 A | * | 11/1993 | Lin .................................. 257/89 |
| RE34,861 E | | 2/1995 | Davis |
| 7,394,148 B2 | | 7/2008 | Karnezos ....................... 257/686 |
| 8,288,793 B2 | * | 10/2012 | Kim et al. ........................ 257/99 |
| 2004/0046242 A1 | * | 3/2004 | Asakawa ....................... 257/678 |
| 2004/0079957 A1 | | 4/2004 | Andrews et al. .............. 257/100 |

(Continued)

FOREIGN PATENT DOCUMENTS

| | | |
|---|---|---|
| CN | 201294227 | 8/2009 |
| CN | 201294227 Y | 8/2009 |

(Continued)

OTHER PUBLICATIONS

U.S. Appl. No. 11/656,759, filed Jan. 22, 2007, Ashay Chitnis.

(Continued)

*Primary Examiner* — Minh-Loan Tran
*Assistant Examiner* — Fazli Erdem
(74) *Attorney, Agent, or Firm* — Koppel, Patrick, Heybl & Philpott (57) ABSTRACT

The present invention is directed to LED packages and LED displays utilizing thin/low profile LED packages with improved structural integrity, emission characteristics, and customizable attributes. In some embodiments the improved structural integrity is provided by various features in the lead frame that cooperate with the casing for a stronger package. Moreover, in some embodiments the improved emission characteristics are provided by cavity features such as shape and depth, which provide for increased surface bonding area for multiple LED chips and increased viewing angle, respectively. Some embodiments also provide for gradated packages having customizable top portions for applications using smaller packages, with bottom portions comprising dimensions compatible with customary mechanical/electrical supports.

41 Claims, 9 Drawing Sheets

(56) References Cited

U.S. PATENT DOCUMENTS

| | | | |
|---|---|---|---|
| 2006/0102918 A1* | 5/2006 | Su et al. | 257/99 |
| 2007/0262328 A1* | 11/2007 | Bando | 257/79 |
| 2007/0295975 A1* | 12/2007 | Omae | 257/89 |
| 2008/0041625 A1 | 2/2008 | Cheong et al. | |
| 2008/0093720 A1 | 4/2008 | Hiew et al. | |
| 2008/0277685 A1 | 11/2008 | Kim | |
| 2009/0050907 A1 | 2/2009 | Yuan et al. | 257/88 |
| 2009/0057850 A1 | 3/2009 | Moy | |
| 2009/0072251 A1* | 3/2009 | Chan et al. | 257/89 |
| 2009/0129085 A1 | 5/2009 | Aizar et al. | 362/247 |
| 2009/0230413 A1 | 9/2009 | Kobayakawa et al. | |
| 2010/0084681 A1 | 4/2010 | Nakajima et al. | 257/99 |
| 2010/0090239 A1 | 4/2010 | Lin et al. | 257/98 |
| 2010/0155748 A1 | 6/2010 | Chan | |
| 2010/0193816 A1* | 8/2010 | Liu | 257/98 |
| 2010/0237378 A1 | 9/2010 | Lin et al. | |
| 2011/0095316 A1* | 4/2011 | Chen et al. | 257/98 |

FOREIGN PATENT DOCUMENTS

| | | |
|---|---|---|
| EP | 2148369 A1 | 1/2010 |
| JP | 058950 | 2/1993 |
| JP | 20042208387 | 8/2004 |
| JP | 2008479116 | 2/2008 |
| JP | 200898218 | 4/2008 |
| WO | WO 2010/081403 A1 | 7/2010 |

OTHER PUBLICATIONS

U.S. Appl. No. 11/899,790, filed Sep. 7, 2007, Ashay Chitnis.
U.S. Appl. No. 11/473,089, filed Jun. 21, 2006, Eric J. Tarsa.
International Search Report and Written Opinion for PCT/CN2011/077823 mailed Oct. 20, 2011.
International Search Report and Written Opinion for counterpart Application No. PCT/CN2010/001864 dated Nov. 22, 2010.
Office Action from U.S. Appl. No. 12/957,225, dated: Aug. 24, 2012.
International Preliminary Report and Written Opinion for PCT Patent Application No. PCT/CN2010/001864, dated Oct. 26, 2012.
Office Action from U.S. Appl. No. 12/939,096, dated Feb. 5, 2014.
Office Action from U.S. Appl. No. 13/192,293, dated Jan. 16, 2014.
Notification of Rectification from Chinese Patent Appl. No. 2013-10208431.2, dated Sep. 23, 2013.
First Notification of Rectification from Chinese Patent Appl. No. 2013-20304753.2, dated Sep. 24, 2013.
Office Action from U.S. Appl. No. 12/957,225, dated Nov. 6, 2013.
Office Action from U.S. Appl. No. 12/939,096, dated Nov. 13, 2012.
Response to OA from U.S. Appl. No. 12/939,096, filed Feb. 13, 2013.
Office Action from U.S. Appl. No. 12/939,096, dated Feb. 28, 2013.
Response to OA from U.S. Appl. No. 12/939,096, filed May 28, 2013.
Office Action from U.S. Appl. No. 12/939,096, dated Jun. 24, 2013.
Office Action from U.S. Appl. No. 12/957,225, dated Mar. 25, 2013.
Response to OA from U.S. Appl. No. 12/957,225, filed May 15, 2013.
Office Action from U.S. Appl. No. 12/957,225, dated Jun. 3, 2013.
Response to OA from U.S. Appl. No. 12/957,225, filed Jun. 7, 2013.
Office Action from U.S. Appl. No. 13/192,293, dated Aug. 27, 2013.
Second Notification of Rectification from Chinese Patent Appl. No. 201320304753.2, dated Jan. 2, 2014.
Office Action from Japanese Patent Appl. No. 2013-504088, dated Jul. 1, 2014.
Office Action from U.S Appl. No. 12/957,225, dated Apr. 30, 2014.

* cited by examiner

SURFACE MOUNT DEVICE THIN PACKAGE

BACKGROUND OF THE INVENTION

1. Field of the Invention

The present invention relates generally to electronic packaging, and more particularly to thin/low profile surface mount packaging having multiple, aligned emitters for application versatility.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In recent years, there have been dramatic improvements in LED technology such that LEDs with increased brightness and color fidelity, smaller footprints, and overall improved emitting efficiency have been introduced. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other light sources while consuming less power. For these and other reasons, LEDs are becoming more popular and are now being used in more and more applications that have traditionally been the realm of incandescent, fluorescent, halogen and other emitters.

Due at least in part to these improved LEDs and improved image processing technology, LEDs can be used as the light source for a variety of display types. In order to use LED chips in these types of applications, it is known in the art to enclose one or more LED chips in a package to provide environmental and/or mechanical protection, color selection, light focusing and the like. An LED package also includes electrical leads, contacts or traces for electrically connecting the LED package to an external circuit. The LED packages are commonly mounted on a printed circuit board (PCB).

Different LED packages can be used as the light source for displays, both big and small. Large screen LED-based displays are becoming more common in many indoor and outdoor locations, while smaller screen LED-based displays such as televisions, gaming machines, and computer monitors are becoming more common in many indoor locations such as homes and businesses. These LED-based displays can comprise thousands of "pixels" or "pixel modules", each of which can contain a plurality of LEDs. The pixel modules can use high efficiency and high brightness LEDs that allow the displays to be visible from various distances and in a variety of environmental lighting conditions. The pixel modules can have as few as three or four LEDs that allow the pixel to emit many different colors of light from combinations of red, green, blue, and/or sometimes yellow light.

Most conventional LED based displays are controlled by a computer system that accepts an incoming signal (e.g. TV signal), and based on the particular color needed at the pixel module to form the overall display image, the computer system determines which LED(s) in each of the pixel modules is to emit light and how brightly. A power system can also be included that provides power to each of the pixel modules; the power to each of the LEDs can be modulated so light is emitted at the desired brightness. Conductors are provided to apply the appropriate power signal to each of the LEDs in the pixel modules.

Viewers are often not directly in front of an LED-based display when it is viewed. Both indoor and outdoor displays are viewable across a substantial range of off-axis angles, such as up to 145° or even greater. Depending on where the viewer is located, the horizontal and/or vertical viewing angle can be different. Furthermore, when a person is moving by an LED display, it is viewed at many different angles. Typical LED displays with peak emissions near the center can experience a drop-off in emission intensity at different angles. The far field pattern (FFP) for the different LED packages in each of the pixel modules can also be different such that the LED display can experience image quality variations when viewed from different angles.

Thin, flat panel displays are becoming more common in both indoor and outdoor applications. As the popularity of flat displays rises, LED packages incorporated into such displays have necessarily become thinner/lower profile. The thin/low profile packages are expected to be robust such that they maintain their structural integrity during manufacture and use, but the integrity of such packages can become compromised. For example, in current thin/low profile packages in the art, the package structures can become deformed during the reflow process. Furthermore, current thin/low profile packages may experience separation between the package casing and the leads/lead frame during manufacture and use.

Additionally, as emitter packages become smaller and lower profile, the amount of space available for emitting components (such as LEDs) on the electrically conductive portions of the packages is at a premium. The smaller packages may also comprise dimensions which prevent them from corresponding with mounting portions of conventional PCBs or other suitable mechanical/electrical supports.

SUMMARY OF THE INVENTION

The present invention provides emitter packages and LED displays that provide for improved color emission uniformity at different viewing angles, with the emitter packages being thin/low profile for flatter applications. The present invention also provides emitter packages with improved structural integrity, with the packages having suitable surface area for mounting a desired number of LED chips and corresponding components. Moreover, the present invention provides customizable emitter packages, which may allow for attachment to standardized mechanical/electrical supports.

One embodiment comprises an emitter package, with the package comprising a casing with a cavity extending into the interior of the casing from a top surface of the casing, an electrically conductive lead frame integral to the casing, and a plurality of light emitting devices arranged on conductive parts of the lead frame. The lead frame comprises features that cooperate with the casing to provide a robust connection between the lead frame and the casing. The light emitting devices and portions of the lead frame are exposed through the cavity. The bottom of the cavity comprises a different shape than the top of the cavity, with the shape of the cavity bottom increasing the surface area of the exposed lead frame portions.

Pursuant to another embodiment, an emitter package is provided comprising a casing with a cavity extending into the interior of the casing from a top surface of the casing, a lead frame integral to the casing, and a plurality of light emitting devices arranged on portions of the lead frame exposed through the cavity. The lead frame comprises features that cooperate with the casing to provide a robust connection between the lead frame and the casing. The casing comprises a step-wise gradation such that the dimensions of the bottom of the casing are greater than the dimensions of the top of the casing.

In accordance with yet another embodiment, a low profile emitter package is provided comprising a casing with a cavity extending into the interior of the casing from a top surface of the casing, a lead frame integral to the casing, and a plurality of LEDs arranged in linear alignment on the lead frame, with the LEDs and portions of the lead frame exposed through the cavity. The lead frame comprises features that cooperate with the casing to provide a robust connection between the lead frame and casing. The height of the package is between 0.9 to 1.35 mm.

In yet another embodiment according to the present invention, a light emitting device display is provided, comprising a substrate carrying an array of emitter packages, and electrically connected drive circuitry to selectively energize the array for producing visual images on the display. Each of the emitter packages comprises a casing with a cavity extending into the interior of the casing from a top surface of the casing, a lead frame integral to the casing, and a plurality of LEDs arranged in linear alignment on the lead frame, with the LEDs and portions of the lead frame exposed through the cavity. The cavity has a depth of less than or equal to 0.5 mm. The lead frame comprises features that cooperate with the casing to provide a robust connection between the lead frame and the casing.

These and other further features and advantages of the invention would be apparent to those skilled in the art from the following detailed description, taken together with the accompanying drawings, in which:

BRIEF DESCRIPTION OF THE DRAWINGS

FIG. 5 is an end elevation view of the embodiment shown in FIG. 1, with the opposite end being substantially similar;

FIG. 6 is a side elevation view of the embodiment shown in FIG. 1, with the opposite side being substantially similar;

FIG. 7 is a top view of a lead frame in accordance wi one embodiment that may be used in the device of FIG. 1;

FIG. 7a is a cross section view of the embodiment of FIG. 7 as seen along the line 7a-7a in FIG. 7;

FIG. 14 is an end elevation view of the embodiment shown in FIG. 11, with the opposite end being substantially similar;

FIG. 15 is a side elevation view of the embodiment shown in FIG. 11, with the opposite side being substantially similar;

DETAILED DESCRIPTION OF THE INVENTION

The present invention is described herein with reference to certain embodiments, but it is understood that the invention can be embodied in many different forms and should not be construed as limited to the embodiments set forth herein.

In some embodiments according to the present invention, structures are provided for thin/low profile, multiple emitter packages that allow the packages to emit light with improved color uniformity at greater viewing angles by linearly aligning the emitters within the package and minimizing the depth of the package cavity. Moreover, some embodiments of the present invention provide thin/low profile emitter packages that maintain structural integrity during manufacture and use due in part to features in the package lead frame enabling the package casing and lead frame to strongly adhere to one another, thus providing a robust connection between them. Such features may include metal gaps of varying sizes between adjacent portions of the lead frame, cuts in the lead frame, through-holes in the lead frame, indentations in the lead frame, bent leads, and the like.

In still other embodiments, the shape of the package cavity can be customized such that the bottom of the cavity has a unique shape providing greater available surface area for the bonding of a desired number of diodes, while the top of the cavity is conventionally shaped (such as being circular) to maximize light emission and viewing angle. This special cavity allows for more diodes to be included in a package that would otherwise be too small (and hence have too little surface area) to carry the desired number of diodes. In other embodiments according to the present invention, the casing of the package may include step-wise gradations that enable the lower portion of a package to be mounted on customary electronic/mechanical supports such as standardized PCBs, while the upper portion can be sized down for smaller applications.

The present invention is applicable to different types of emitter packages such as surface mount devices (SMDs) that can be used in many different lighting applications such as LED color screens or decorative lighting. Different embodiments of emitter packages are described below that utilize light emitting diodes as their emitters, but it is understood that other emitter package embodiments can use different types of emitters.

It will be understood that when an element is referred to as being "on", "connected to", "coupled to", or "in contact with"

another element, it can be directly on, connected or couple to, or in contact with the other element or intervening elements may be present. In contrast, when an element is referred to as being "directly on", "directly connected to", "directly coupled to", or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, regions, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 1-10 show one embodiment of a thin/low profile multiple emitter package 10 according to the present invention that comprises an SMD. As mentioned above, it is understood that the present invention can be used with other types of emitter packages beyond SMDs. The package 10 comprises a casing 12 that carries an integral lead frame 14. The lead frame 14 comprises a plurality of electrically conductive connection parts used to conduct electrical signals to the package's light emitters. The lead frame may also assist in dissipating heat generated by the emitters in applications where a significant amount of heat is produce by the package's emitters.

The lead frame 14 can be arranged in many different ways and different numbers of parts can be utilized in different package embodiments. The package 10 is described below utilizing three emitters, and in the embodiment shown, the lead frame is arranged so each of the emitters is driven by a respective electrical signal. Accordingly there are six conductive parts in the embodiment shown, comprising a pair of conductive parts for each emitter with an electrical signal applied to each of the emitters through its conductive part pair. For the package 10, the conductive parts comprise first, second and third anode parts 16, 18, 20, and first, second and third cathode parts 22, 24, 26 (best shown in FIG. 7), each having an emitter attach pad. However, it is understood that some embodiments can comprise less than three LEDs, while others can comprise less than six LEDs and still others can comprise more than three LEDs. The LEDs in these various embodiments can each have their own respective conductive part pair, or can share conductive parts with other LEDs. The cost and complexity of the packages can be generally lower with fewer LED chips.

The casing 12 can have many different shapes and sizes, and in the embodiment shown is generally square or rectangular, with upper and lower surfaces 28 and 30, side surfaces 32 and 34 and end surfaces 36 and 38. The upper portion of the casing further comprises a recess or cavity 40 extending from the upper surface 28 into the body of the casing 12 to the lead frame 14. Emitters are arranged on the lead frame such that light from the emitters emits from the package 10 through the cavity 40. In some embodiments, a reflector component such as a reflective insert or ring 42 (shown in FIG. 3) may be positioned and secured along at least a portion of a side or wall 44 of the cavity 40.

Figure 10:
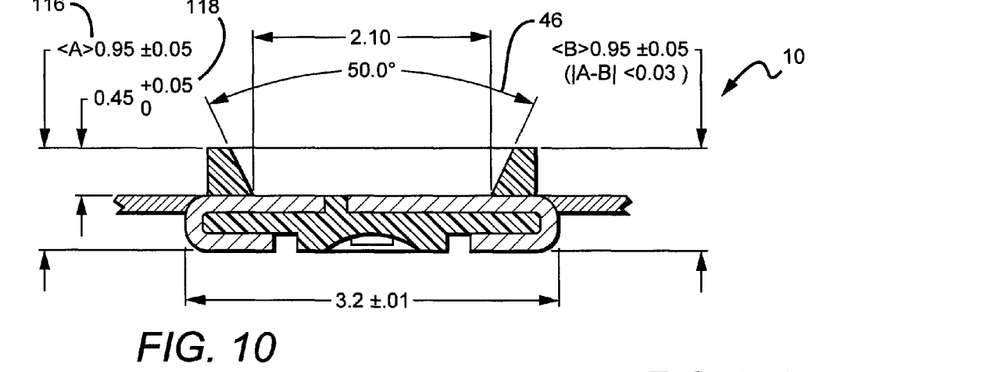
FIG. 10 is a side dimensional view of the embodiment shown in FIG. 1.
Figure 11:
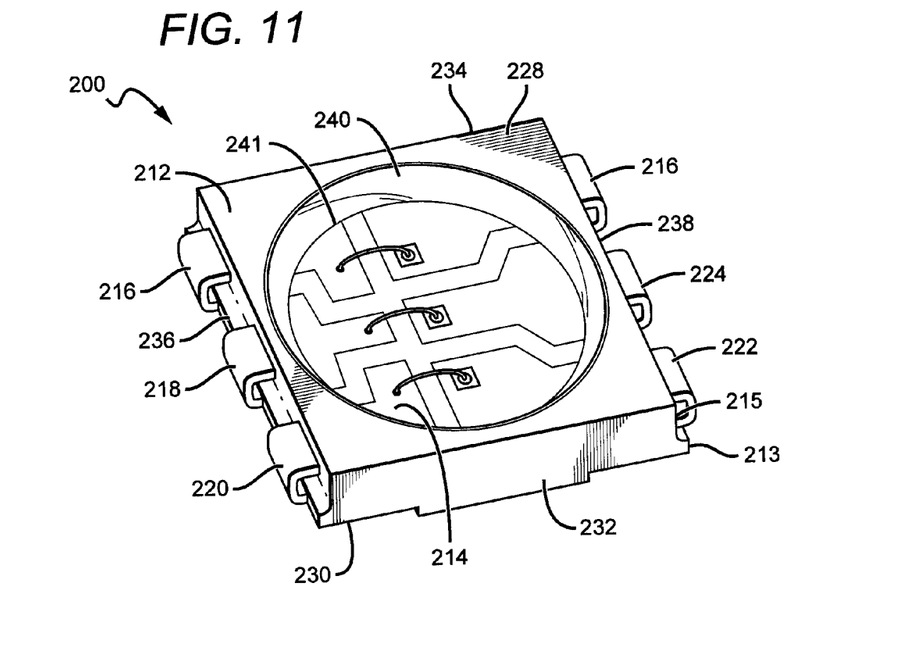
FIG. 11 is a perspective view of another embodiment of an emitter package according to the present invention.
Figure 12:
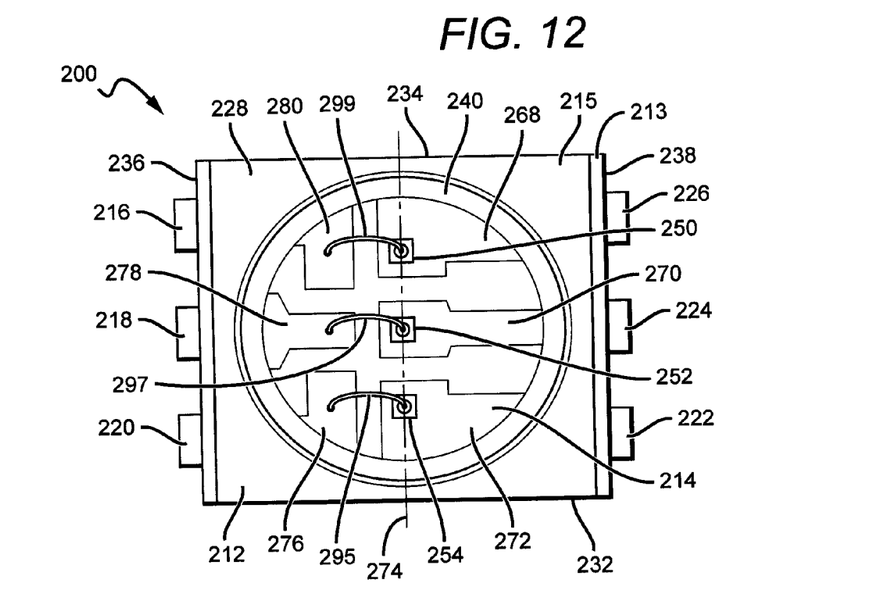
FIG. 12 is a top plan view of the embodiment shown in FIG. 11.
Figure 13:
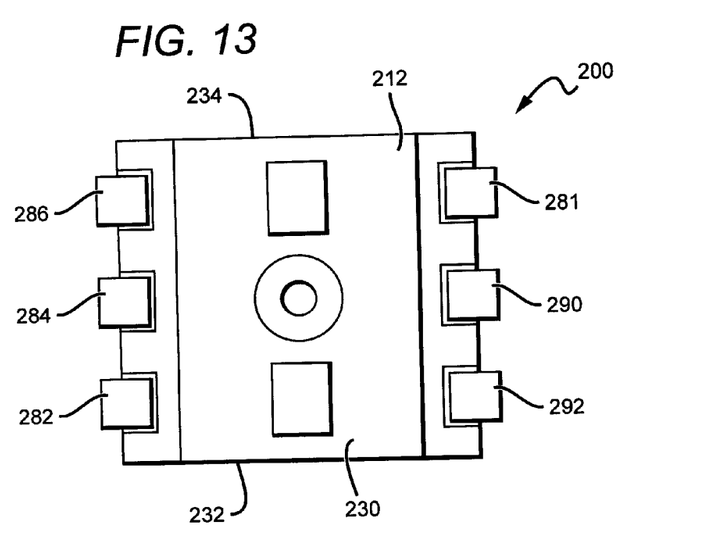
FIG. 13 is a bottom view of the embodiment shown in FIG. 11.
Figure 14:
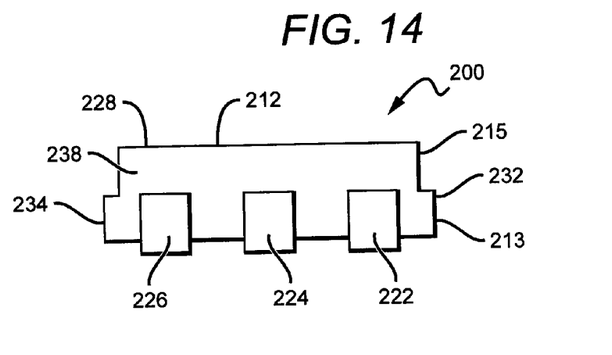
Figure 15:
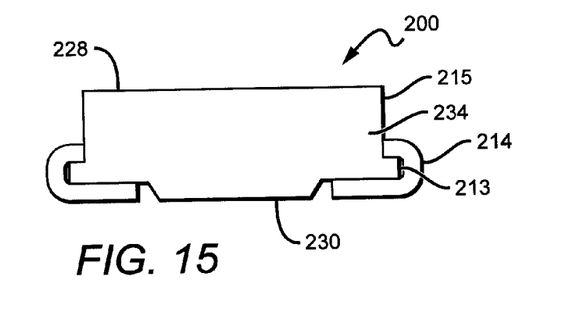

The effectiveness of the reflectivity of the ring 42 and the emission angle of the package can be enhanced by tapering the cavity 40 and ring 42 carried therein inwardly toward the interior of the casing. By way of example and not by limitation and as best shown in FIG. 10, a cavity angle 46 of ~50.0 degrees may provide for a suitable and desired viewing angle as well as the desired reflectivity if a reflector component is included. In another possible embodiment, a cavity angle of ~90.0 degree may provide for a suitable and desired viewing angle. In still other possible embodiments, a cavity angle of less than 50.0 degrees, greater than 50.0 degrees, between 50.0-90.0 degrees, and/or greater than 90.0 degrees may provide for suitable and desirable viewing angles.

Moreover, the depth of cavity 40 can be customized to increase the viewing angle of the package. By way of example and not limitation, in the thin/low profile package of this embodiment, a small cavity 40 depth of 0.45 mm+/−0.05 mm (as shown in FIG. 10) may provide a desirable, increased viewing angle. In another possible embodiment, a cavity depth of less than 0.45 mm may provide a desired viewing angle. In still other possible embodiments, a cavity depth of greater than 0.45 mm but less than the overall height of the emitter package may provide a desired viewing angle.

In some embodiments, the bottom portion 41 of the cavity 40 adjacent the exposed portions of the lead frame 14 may comprise a different shape than the top portion 43 of the cavity 40. In the embodiment best shown in FIGS. 1 and 2, the bottom portion 41 of cavity 40 is defined by a shape comprising four arcs, with the shape resembling a square with curved sides. The top portion 43 is defined by a circle. It is understood that bottom and top portions 41, 43 may comprise any variety of suitable shapes according to the present invention. The different shape of the bottom portion 41 allows for more of lead frame 14 to be exposed through cavity 40 compared to conventional cavities maintaining a circular shape from top to bottom, which increases the available surface area of lead frame 14 upon which various types of LEDs or other diodes may be Mounted (as discussed in more detail below). Increasing the available lead frame 14 surface area exposed in the cavity 40 may be necessary in particularly small emitter packages, which in the absence of a suitable shape for bottom portion 41, may not be able to fit a desired number of mounted diodes or other device components.

In some embodiments, the cavity 40 may be at least partially filled with a fill material/encapsulant 48 that can protect and positionally stabilize the lead frame 14 and the emitters carried thereby. In some instances, the fill material/encapsulant 48 may cover the emitters and the portions of the lead frame 14 exposed through the cavity 40. The fill material/encapsulant 48 may be selected to have predetermined optical properties so as to enhance the projection of light from the LEDs, and in some embodiments is substantially transparent to the light emitted by the package's emitters. The fill material/encapsulant 48 may be substantially flat along its top surface, or can also be shaped, such as hemispheric or bullet shaped, or can be fully or partially concave in the cavity 40. The fill material/encapsulant 48 may be formed from a silicone, resin, an epoxy, a thermoplastic polycondensate, glass, and/or other suitable materials or combinations of materials. In some embodiments, materials may be added to the fill material/encapsulant 48 to enhance the emission, absorption and/or dispersion of light to and/or from the LEDs.

The casing 12 may be fabricated of material that is electrically insulating; it may also be thermally conductive. Such materials are well-known in the art and may include, without limitation, thermoplastic polycondensates (e.g., a polyphthalamide (PPA)), certain ceramics, resins, epoxies, and glass. The casing 12 may also be formed of dark or black material(s) to improve contrast in image generation SMD packages, such as with SMDs employed in video displays.

The package 10 and its casing 12 may be formed and/or assembled through any one of a variety of known methods as is known in the art. For example, the casing 12 may be formed or molded around the anode parts 16, 18, 20 and cathode parts 22, 24, 26, such as by injection molding. The hole 47 shown in FIG. 4 may be present in packages formed by known injection molding techniques, as it represents the point of entry for casing material to be injection molded over said lead frame 14. Alternatively, the casing may be formed in sections, for example, top and bottom sections, with the anode parts 16, 18, 20 and cathode parts 22, 24, 26 formed on the bottom section. The top and bottom sections can then be bonded together using know methods and materials, such as by an epoxy, adhesive or other suitable joinder material.

In the illustrative embodiment depicted, the package 10 utilizes first, second and third LEDs 50, 52, 54, each of which can emit the same color of light or different color of light than the others. In the embodiment shown, the LEDs 50, 52, 54 emit blue, red, and green colors, respectively, so that when appropriately energized the LEDs produce in combination a substantially full range of colors. Further, when appropriately energized, the LEDs 50, 52, 54 can emit a white light combination of different color temperatures. It is understood that more or less than three LEDs can be utilized in a package according to the present invention, with the LEDs emitting any desired color.

The package 10 can also comprise elements to protect against damage from electrostatic discharge (ESD). Different elements can be used such as various vertical Zener diodes (not shown), different LEDs arranged in parallel and reverse biased to the LED chips 50, 52, 54 (not shown), surface mount varistors (not shown), and lateral Si diodes (not shown). In embodiments using a Zener diode, it can be mounted to a separate attach pad using known mounting techniques. The diode may be relatively small so it does not cover an excessive area on the surface of the lead frame 14 exposed by the cavity 40. When utilizing groups of LEDs coupled in series only one ESD element is needed for each series group.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely' doped epitaxial layers, all of which are formed successively on a growth substrate or wafer. LED chips formed on a wafer can be singulated and used in different application, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a possible embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent applications Ser. Nos. 11/656,759 and 11/899,790, both entitled "Wafer Level Phosphor Coating Method and Devices Fabricated Utilizing Method", and both of which are incorporated herein by reference. Alternatively, the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

In the illustrative embodiment shown, the lead frame's anode and cathode parts 16, 18, 20, 22, 24, 26 project outwardly through the opposed surfaces 36 and 38 of the casing 12. Anode parts 16, 18, 20 extend from surface 36, and cathode parts 22, 24, 26 extend from surface 38. The anode and cathode parts are arranged to operate in pairs to conduct an electrical signal to their respective light emitter when the package 10 is surface mounted for operation. In the embodiment shown, the anode and cathode parts 16, 18, 20, 22, 24, 26 are bent orthogonally to extend outside of and down along their end surfaces 36 and 38 of the casing, then bent orthogonally again to form end portions 82, 84, 86, 88, 90, 92 that extend along the lower surface 30 of the casing 12. The outwardly facing surfaces of the end portions 82, 84, 86, 88, 90, 92 of the leads are substantially flush with the bottom of the casing 12 to facilitate connection to an underlying mechanical/electronic support structure 94 such as a PCB.

Figure 3:
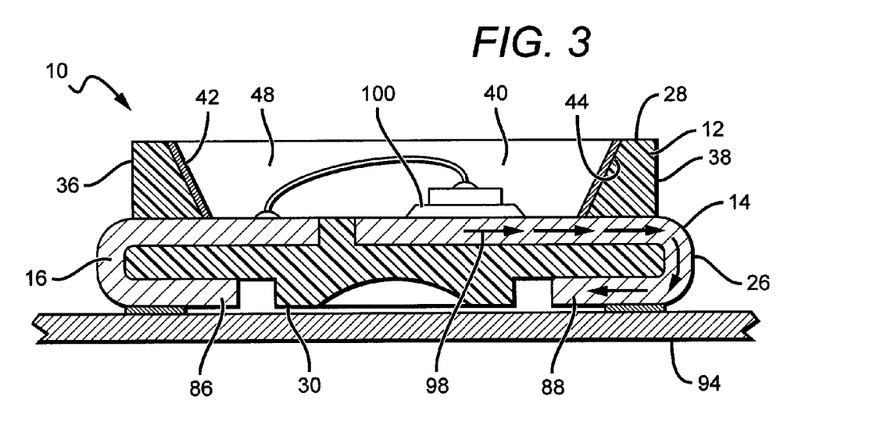
FIG. 3 is a cross section view of the embodiment of FIG. 1 as seen along the line 3-3 in FIG. 2.
Figure 4:
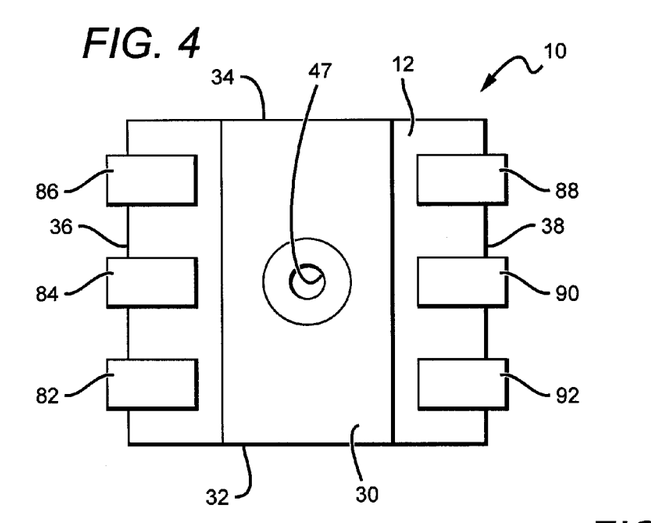
FIG. 4 is a bottom view of the embodiment shown in FIG. 1.
Figure 5:
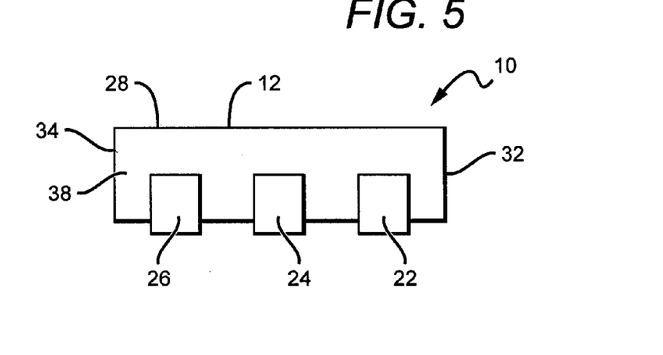

As best shown in FIG. 3, the end portions 82, 84, 86, 88, 90, 92 (with only end portions 86, 88 being visible) of the leads can be electrically connected or bonded to traces or pads on the support structure 94 using any of a number of well-known connection techniques, including soldering. It is understood that in other embodiments all or some of the end portions 82, 84, 86, 88, 90, 92 can be bent in an opposite direction while still allowing for surface mounting.

The cathode parts 22, 24, 26 comprise central surfaces or mounting pads 68, 70, 72 for carrying the LED chips 50, 52, 54 in a linear array that extends in a direction 74 perpendicular to the side surfaces 32 and 34, with the LEDs 50, 52, 54 being aligned generally along a central axis of the casing 12. This alignment allows for improved color uniformity at different horizontal viewing angles compared to packages having LEDs arranged in other ways, such as in a cluster. It is understood that a linear array extending in a direction perpendicular to side surfaces 36, 38 would allow for improved color uniformity at different vertical viewing angles.

Mounting pads 68 and 78 may extend toward the center of the casing 12, which allows for the LEDs 50, 54 to be mounted closer to the center of the casing 12 so they can emit out of the cavity 40. The anode parts 16, 18, 20 include electrical connection pads 76, 78, 80, respectively, positioned adjacent to, but spaced apart from, the mounting pads 68, 70, 72 via gap 96. Connection pads 76 and 80 extend toward the center of the casing 12 to allow for electrical connection to LED 50, 54 that are mounted closer to the center of the casing 12 by extensions of mounting pads 68, 70.

The anode parts 16, 18, 20 run generally parallel to one another and cathode parts 22, 24, 26 run generally parallel to one another other, with all extending in a direction perpendicular to the direction 74 of the linear LED array. The leads can have different widths and can be small enough that when the package 10 is viewed from the top, they are minimally visible or not visible. Additionally and/or alternatively, the leads may be obstructed from view from the top by the casing 12.

Figure 1:
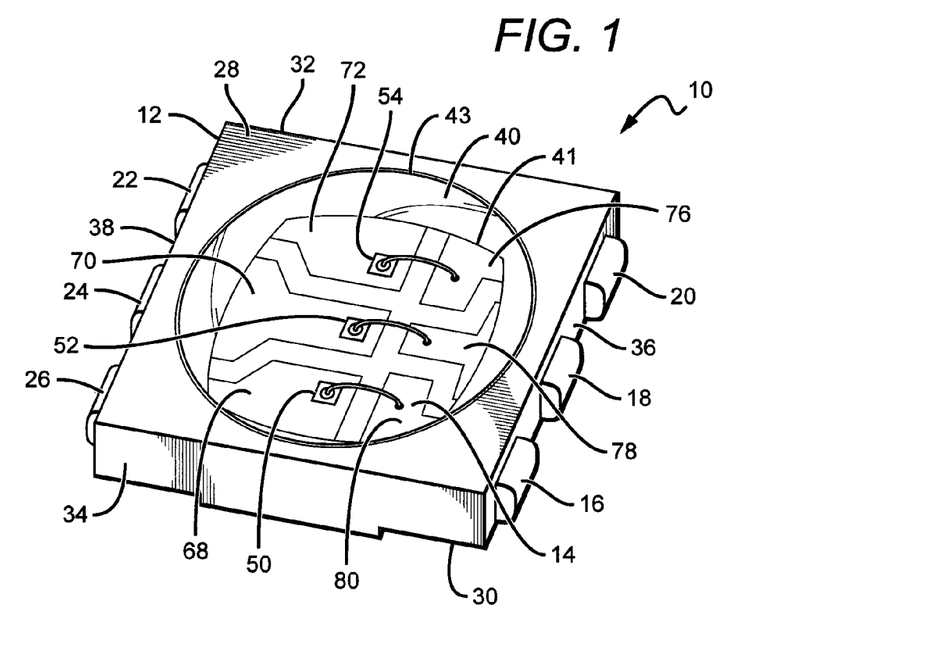
FIG. 1 is a perspective view of an emitter package according to the present invention.
Figure 2:
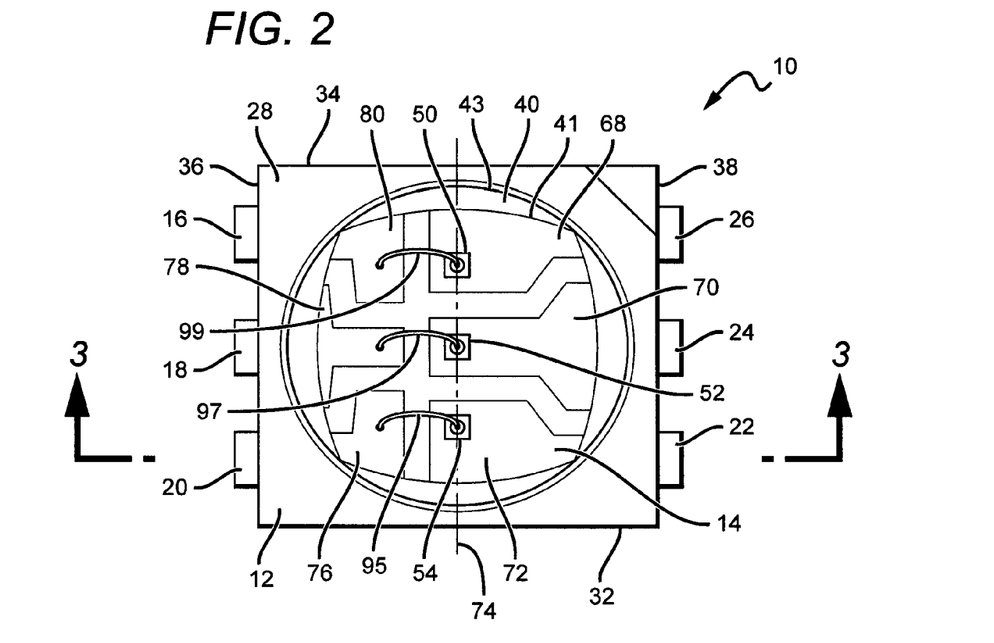
FIG. 2 is a top plan view of the embodiment shown in FIG. 1.

As best seen in FIGS. 1 and 2, the cavity 40 extends into the casing interior a sufficient depth to expose the attach and connection pads 68, 70, 72, 76, 78, 80. In a possible embodiment, each of the LEDs 50, 52, 54 has its own pair of contacts or electrodes arranged so that when an electrical signal is applied across the contacts, the LED emits light. The contacts of the LEDs are electrically connected to an anode and cathode part pair. Ensuring that each of the LEDs 50, 52, 54 has its own cathode and anode pair can be advantageous for a number of reasons, such as providing easier electrical control of each LED.

In accordance with a typical implementation of the embodiments shown, one of the contacts of LEDs 50, 52, 54 is coupled to the chip carrier pads 68, 70, 72, while the other of LEDs 50, 52, 54 contacts is coupled to the pads 76, 78, 80. However, it is understood that pads 76, 78, 80 can carry the chips instead, with pads 68, 70, 72 being electrically connected to pads 76, 78, 80. Different known structures and methods can be used for making this connection, with one such structure being wire bonds 95, 97, 99 applied using known methods. Although one possible wire bond configuration is shown, it is understood that various, other suitable wire bond configurations are possible depending on the structure of each chip. For example, there may be more than one wire bonds on one chip, with one wire bond attached to a connection pad, and the other wire bond attached to a chip carrier pad.

The anode parts 16, 18, 20 and cathode parts 22, 24, 26 may be made from an electrically conductive metal or metal alloy, such as copper, a copper alloy, and/or other suitable electrically conductive, low resistivity, corrosion resistant materials or combinations of materials. As noted, the thermal conductivity of the leads may assist, to some extent, in conducting heat away from the LEDs 50, 52, 54 carried by the SMD as shown by the arrow 98. However, in lower power packages (such as those operating at ~20-60 mA) of the present embodiment, thermal management may not be a key concern.

Each of the LEDs 50, 52, 54 may be electrically coupled with its one the pads 68, 70, 72 by means of an electrically and thermally conductive bonding material 100 such as a solder, adhesive, coating, film, encapsulant, paste, grease and/or other suitable material. In one embodiment, the LEDs may be electrically coupled and secured to their respective pads using a solder pad on the bottom of the LEDs. The fabrication of the connector parts 16, 18, 20 and carrier parts 22, 24, 26 may be accomplished by stamping, injection molding, cutting, etching, bending or through other known methods and/or combinations of methods to achieve the desired configurations. For example, the connector parts and/or carrier parts can be partially metal stamped (e.g., stamped simultaneously from a single sheet of relevant material), appropriately bent, and finally fully separated following the formation of some or all of the casing.

In some methods of manufacturing the LEDs may be coupled to the pads 68, 70, 72 prior to molding and/or assembling the casing 12 about the connection pads. Alternatively, the LEDs may be coupled to the pads 68, 70, 72 after the anode and cathode parts have been partially encased within the casing. The cavity 40 that extends into the casing may be configured, such as by a differently shaped bottom portion 41, so that sufficient portions of the pads 68, 70, 72 and pads 76, 78, 80 are exposed to receive the LEDs and the associated wire bonds, and to allow the LEDs to emit light out through the cavity 40.

In conventional packages, the smooth surfaces and narrow paths between the lead frame's anode and cathode parts and the upper and lower portions of the casing make reliable adhesion difficult. These mating smooth surfaces and narrow paths between the metal gaps can reduce the rigidity of the emitter package and can increase the chances of component failure by separation of the casing from the lead frame during both use and manufacturing processes such as reflow. To make the package more robust, the structural integrity of the package is improved by increasing adhesion reliability between the casing and lead frame. This can be accomplished with one or more of the anode parts 16, 18, 20 and cathode parts 22, 24, 26 including one or more indentations, through-holes, apertures, extensions, and/or other features that contribute to the stability, integrity and/or robustness of the SMD package. Furthermore, metal gaps 102, 104, 106, and 108 may be provided at various locations between adjacent anode parts and adjacent cathode parts, with these gaps having greater and varying widths than the narrow paths seen in conventional emitter packages. The gaps are later filled with casing material to form thicker paths and/or path segments between these lead frame portions compared to packages not comprising the larger metal gaps.

Figures 6, 7, 7A:
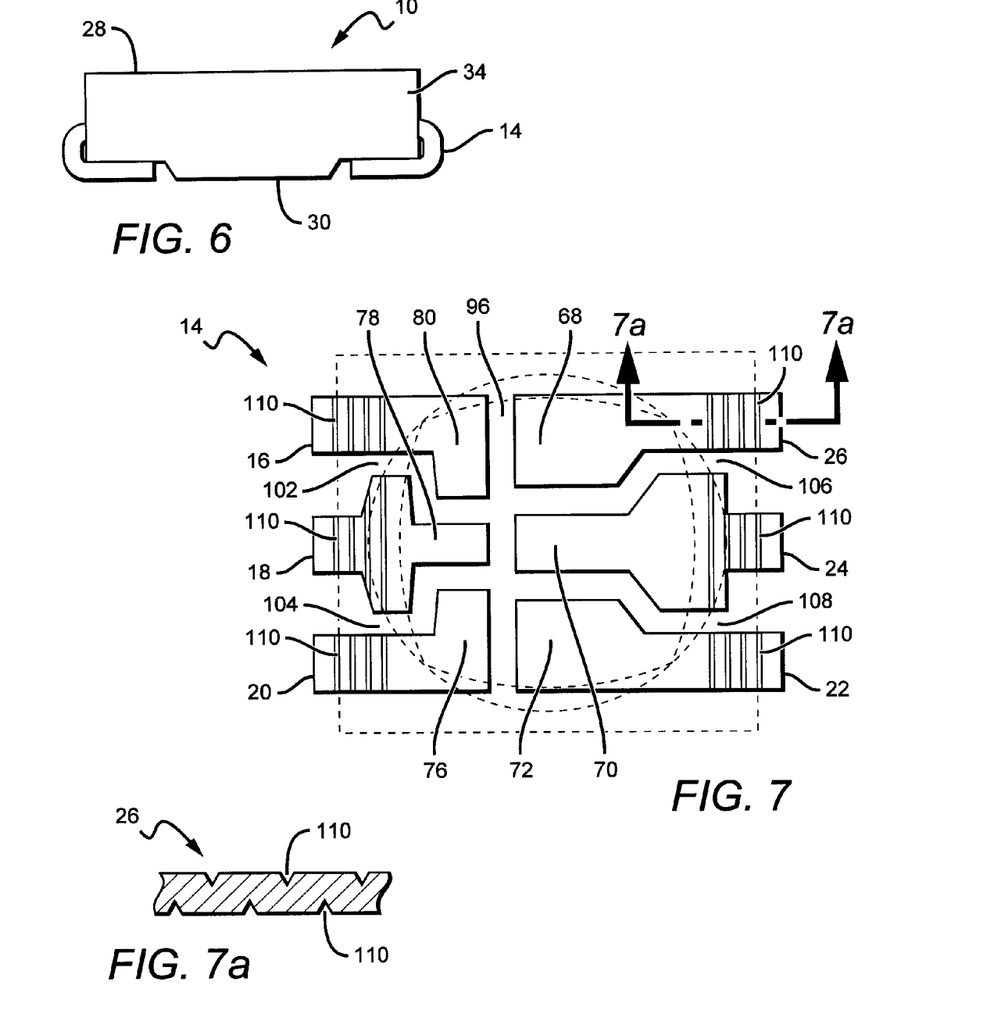
Figure 8:
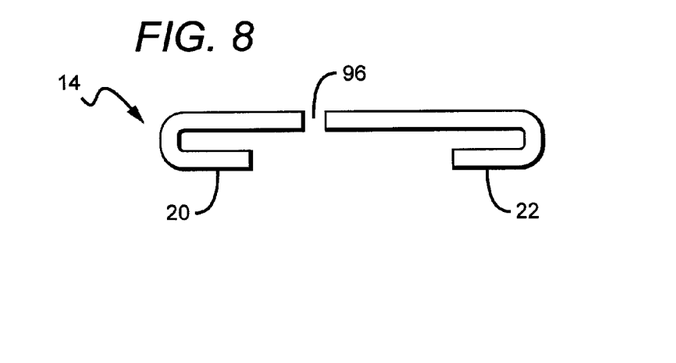
FIG. 8 is a side elevation view of the lead frame shown in FIG. 7.

As best shown in FIG. 7, anode parts 16, 18 and 18 and 20 may have larger metal gaps 102, 104 between them, and cathode parts 22 and 24 and 24 and 26 may have larger metal gaps 106 and 108 between them. When casing material is molded over lead frame 14, it fills in larger metal gaps 102, 104, 106, 108 to create wide paths and/or path segments that can improve the adhesion between casing 12 and lead frame 14 and improve the overall structural integrity/robustness of package 10. The anode and cathode parts may also contain features such as indentations (not shown), through-holes (not shown), or cuts such as V-cuts 110, which can be on the upper and lower surfaces of the anode parts 16, 18, 20 and cathode parts 22, 24, 26. The metal gaps 102, 104, 106, 108, through-holes, indentations, cuts, bent leads, and/or other such features of the lead frame cooperate with the casing and/or fill material, at least in part, to enhance the structural stability and integrity of the package 10. The casing material and/or fill material extends at least partially into and/or through such features of the lead frame to add robustness. Without these types of features for improving the structural integrity of the package, packages can be damaged during fabrication or the lead frame and casing can dissociate during package operation.

Figure 9:
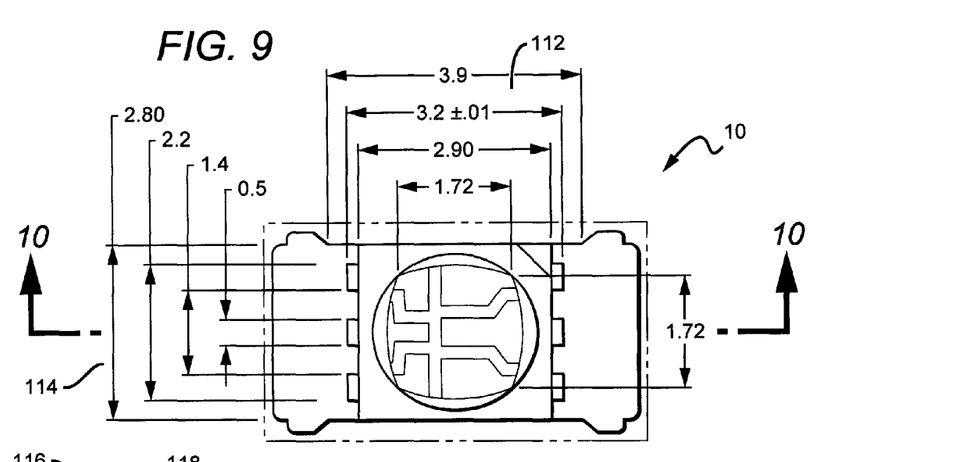
FIG. 9 is a top dimensional view of the embodiment shown in FIG. 1.

With reference now to FIGS. 9-10, some examples of dimensional characteristics of the various components of emitter package 10 are shown. By way of example and not limitation, the package 10 may have an overall length 112 of 3.20+/−0.1 mm, an overall width 114 of ~2.80 mm, and a height 116 of 0.95+/−0.05 mm. In other embodiments, the length may be less than 3.20 mm, less than 5.0 mm, or greater than 3.20 mm. The overall width may be less than 2.80 mm, less than 4.0 mm, or greater than 2.80 mm. According to possible embodiments for a thin/low profile emitter package, the height/thinness of the package may range from 0.9-1.3 mm, may be less than 0.95 mm, or may be less than 1.5 mm.

FIGS. 11-18 show another possible embodiment of a thin/low profile multiple emitter package 200 according to the present invention that may comprise an SMD. The package 200 comprises a casing 212 with integral lead frame 214. The lead frame 214 comprises a plurality of electrically conductive connection parts as described above for package 10.

The package 200 is described below utilizing three emitters, and in the embodiment shown, the lead frame is arranged so each emitter is driven by a respective electrical signal. However, it is understood that other package and lead frame arrangements are contemplated by the present invention. Accordingly, there are six conductive parts in package 200, comprising first, second and third anode parts 216, 218, 220, and first, second and third cathode parts 222, 224, 226.

The casing 212 is generally square or rectangular, with upper and lower surfaces 228 and 230, side surfaces 232 and 234 and end surfaces 236 and 238. The upper portion of the casing further comprises cavity 240 extending from the upper surface 228 into the body of the casing 212 to the lead frame 214. Emitters are arranged on the lead frame such that light from the emitters emits from the package 200 through cavity 240. In some embodiments, a reflector component (not shown) may be positioned and secured along at least a portion of a side or wall 244 of the cavity 240.

Figure 18:
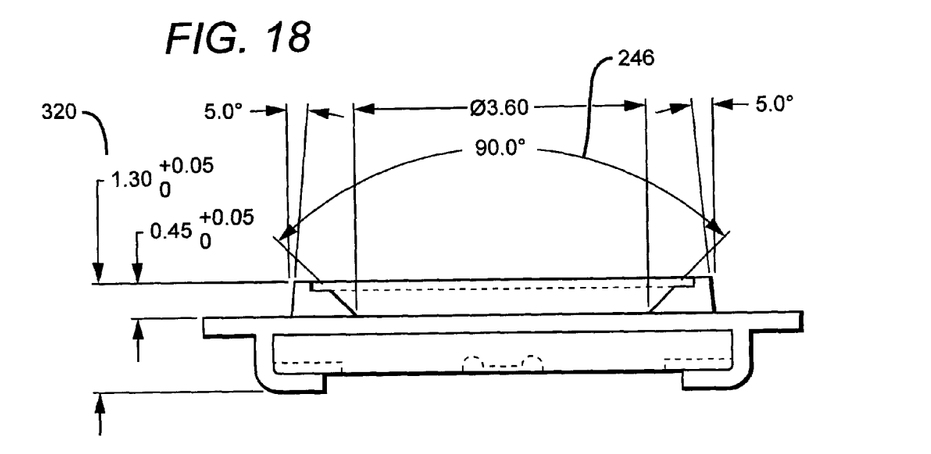
FIG. 18 is a side dimensional view of the embodiment shown in FIG. 11.
Figure 19A:
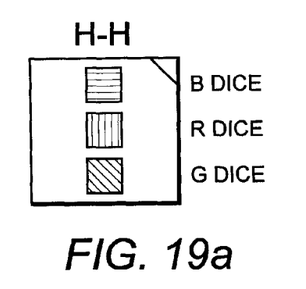
FIG. 19a is a key illustrating H-H alignment as it relates to the emission paths depicted in FIGS. 20a, 20b.
Figure 19B:
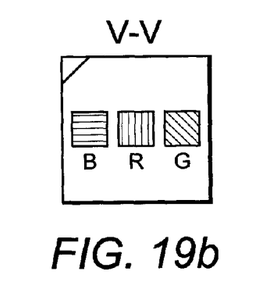
FIG. 19b is a key illustrating V-V alignment as it relates to the emission paths depicted in FIGS. 21a, 21b.
Figure 20A:
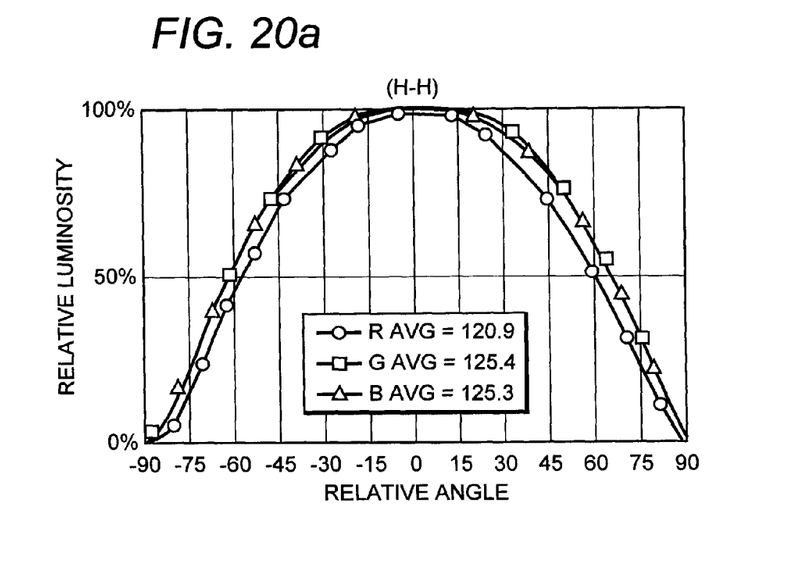
FIG. 20a is a graph illustrating H-H emission paths of the surface mount device embodiment shown in FIG. 1.
Figure 20B:
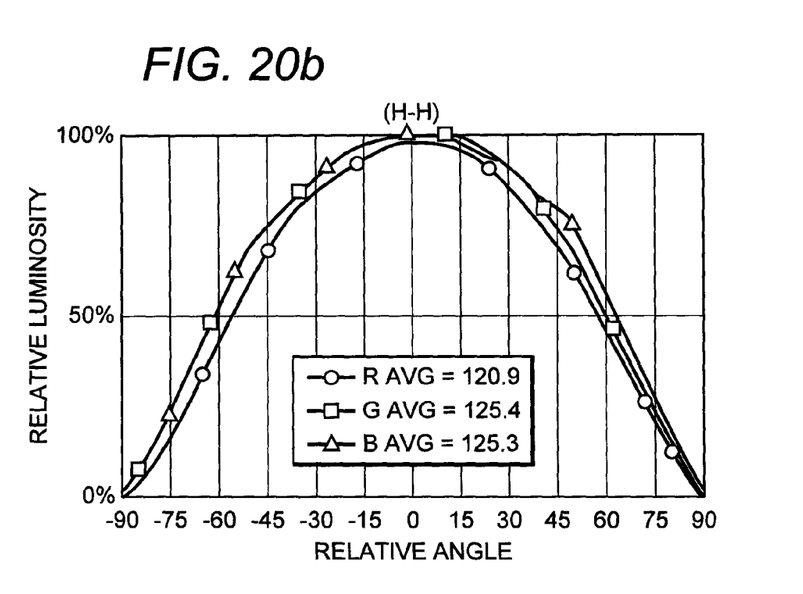
FIG. 20b is a graph illustrating H-H emission paths of the surface mount device embodiment shown in FIG. 11.

The effectiveness of a reflector component (if included) and the emission angle of the package can be enhanced by tapering the cavity 240 and reflector component carried therein inwardly toward the interior of the casing. By way of example and not by limitation and as best shown in FIG. 18, a cavity angle 246 of ~90.0 degrees may provide for a suitable and desired viewing angle as well as the desired reflectivity if a reflector component is included. In another possible embodiment, a cavity angle of ~50.0 degree may provide for a suitable and desired viewing angle. In still other possible embodiments, a cavity angle of less than 90.0 degrees, greater than 90.0 degrees, between 50.0-90.0 degrees, and/or less than 50.0 degrees may provide for suitable and desirable viewing angles.

Moreover, the depth of cavity 240 can be customized to increase the viewing angle of the package. By way of example and not limitation, in the thin/low profile package of this embodiment, a small cavity 240 depth of 0.45 mm+/−0.05 mm (as shown in FIG. 18) may provide a desirable, increased viewing angle. In another possible embodiment, a cavity depth of less than 0.45 mm may provide a desired viewing angle. In still other possible embodiments, a cavity depth of greater than 0.45 mm but less than the overall height of the emitter package may provide a desired viewing angle.

In some embodiments, the casing 212 may comprise stepwise gradations, with a bottom portion 213 of casing 212 being dimensionally larger than a top portion 215 of casing 212. At least one purpose for this step-wise casing 212 is to enable the bottom of the package, with its inclusive lead frame components, to be mounted on conventionally-sized mechanical/electrical supports such as PCBs, while the dimensions of the top of the package can be customized for various desired applications. As such, the new packages 200 can easily be mounted on and electrically connected to supports such as PCBs that are already in use. It is understood that a package according to the present invention can comprise any number and type of gradation to enable the dimensions of the top of the casing 212 to differ from the dimensions of the bottom of the casing 212. For example, more than two step-wise gradations may be included in a package according to the present invention, or a gradual, sloping gradation may also be contemplated.

In some embodiments, the cavity 240 may be at least partially filled with a fill material and/or covered by an encapsulant (not shown) as described above. Moreover, the casing 212 may comprise materials and be formed as described above.

In the illustrative embodiment depicted, the package 200 utilizes first, second and third LEDs 250, 252, 254, each of which can emit the same color of light or different color of light than the others. In the embodiment shown, the LEDs 250, 252, 254 emit blue, red, and green colors, respectively, so that when appropriately energized the LEDs produce in combination a substantially full range of colors. Further, when appropriately energized, the LEDs 250, 252, 254 can emit a white light combination of varying color temperatures. It is understood that more or less than three LEDs can be utilized in a package according to the present invention, with the LEDs emitting any desired color or color combination.

As with package 10 described above, package 200 can comprise elements (not shown) to protect against damage from ESD. Such elements can include Zener diodes, different LEDs arranged in parallel and reverse biased to the LED chips 250, 252, 254, surface mount varistors, and lateral Si diodes. When utilizing groups of LEDs coupled in series only one ESD element is needed for each series group.

In the illustrative embodiment shown, the lead frame's anode and cathode parts 216, 218, 220, 222, 224, 226 project outwardly through the opposed surfaces 236 and 238 of the casing 212. Anode parts 216, 218, 220 extend from surface 236, and cathode parts 222, 224, 226 extend from surface 238. The anode and cathode parts are arranged to operate in pairs to conduct an electrical signal to their respective light emitter when the package 200 is surface mounted for operation. In the embodiment shown, the anode and cathode parts 216, 218, 220, 222, 224, 226 are bent orthogonally to extend outside of and down along their end surfaces 236 and 238 and the bottom portion 213 of the casing, then bent orthogonally again to form end portions 282, 284, 286, 288, 290, 292 that extend along the lower surface 230 of the bottom portion 213 of casing 212. The outwardly facing surfaces of the end portions 282, 284, 286, 288, 290, 292 of the leads are substantially flush with the bottom of the casing 212 to facilitate connection to an underlying mechanical/electronic support structure such as a PCB (not shown), with the PCB comprising electrical connection portions that coincide with end portions 282, 284, 286, 288, 290, 292.

The cathode parts 222, 224, 226 comprise central surfaces or mounting pads 268, 270, 272 for carrying the LED chips 250, 2'52, 254 in a linear array that extends in a direction 274 perpendicular to the side surfaces 232 and 234, with the LEDs 2'50, 252, 254 being aligned generally along a central axis of the casing 212. This alignment allows for improved color uniformity at different horizontal viewing angles compared to packages having LEDs arranged in other ways, such as in a cluster. It is understood that a linear array extending in a direction perpendicular to side surfaces 236, 238 would allow for improved color uniformity at different vertical viewing angles.

Mounting pads 268 and 278 extend toward the center of the casing 212, which allows for the LEDs 250, 254 to be mounted closer to the center of the casing 212 so they can emit out of the cavity 240. The anode parts 216, 218, 220 include electrical connection pads 276, 278, 280, respectively, positioned adjacent to, but spaced apart from, the mounting pads 268, 270, 272 via gap 296. Connection pads 276 and 280 extend toward the center of the casing 212 to allow for electrical connection to LED 250, 254 that are mounted closer to the center of the casing 212 by extensions of mounting pads 268, 270.

The anode parts 216, 218, 220 run generally parallel to one another and cathode parts 222, 224, 226 run generally parallel to one another other, with all extending in a direction perpendicular to the direction 274 of the linear LED array.

The contacts of the LEDs are electrically connected to an anode and cathode pair. In accordance with a typical implementation of the embodiments shown, one of the contacts of LEDs 250, 252, 254 is coupled to the chip carrier pads 268, 270, 272, while the other of LEDs 250, 252, 254 contacts is coupled to the pads 276, 278, 280. However, it is understood that pads 276, 278, 280 can carry the chips instead, with pads 268, 270, 272 being electrically connected to pads 276, 278, 280. Wire bonds 295, 297, 299 can be used for making this connection. Although one possible wire bond configuration is shown, various other suitable wire bond configurations are possible as described above with respect to package 10.

In accordance with a typical implementation of the embodiments shown, one of the contacts of LEDs 50, 52, 54 is coupled to the chip carrier pads 68, 70, 72, while the other of LEDs 50, 52, 54 contacts is coupled to the pads 76, 78, 80. Different known structures and methods can be used for making this connection, with one such structure being wire bonds 95, 97, 99 applied using known methods.

As described above in more detail, to increase the adhesion reliability and structural integrity of the package 200, one or more of the anode parts 216, 218, 220 and cathode parts 222, 224, 226 may further include one or more indentations, through-holes, apertures, extensions, and/or other features that contribute to the stability, integrity and/or robustness of the package. Furthermore, metal gaps 302, 304, 306, and 308 may be provided at various locations between adjacent anode parts and adjacent cathode parts, with these gaps later filled with casing material to form thicker paths and/or segments between these lead frame portions compared to packages not comprising the larger metal gaps.

Figure 16:
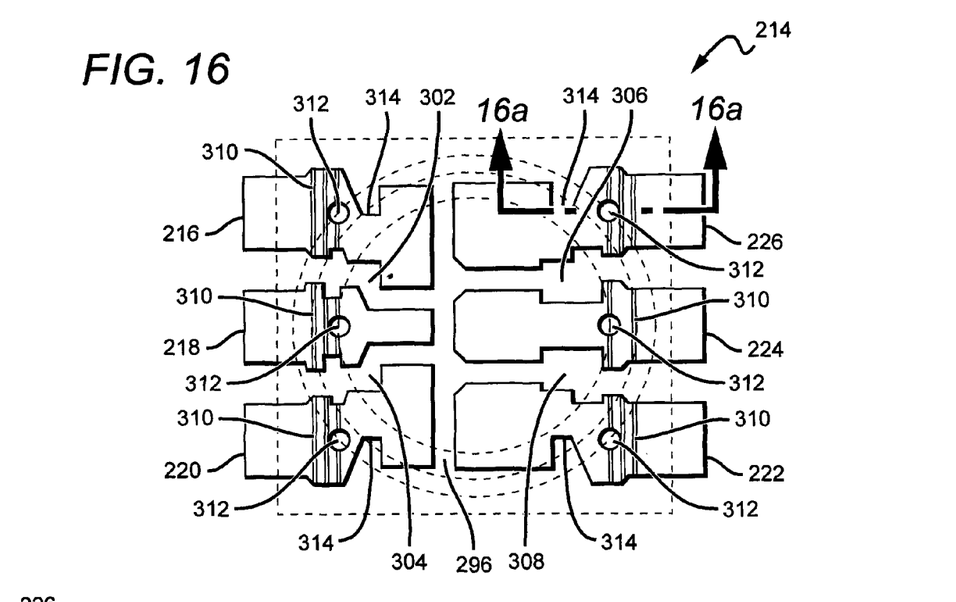
FIG. 16 is a top view of a lead frame in accordance with one embodiment that may be used in the device of FIG. 11.
Figure 16A:
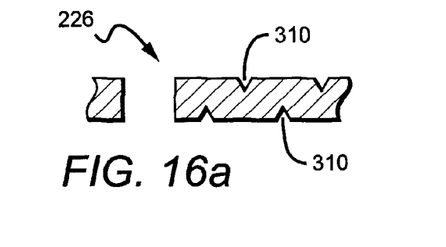
FIG. 16a is a cross section view of the embodiment of FIG. 16 as seen along the line 16a-16a in FIG. 16.

As best shown in FIG. 16, anode parts 216, 218 and 218 and 220 may have metal gaps 302, 304 between them, and cathode parts 222 and 224 and 224 and 226 may have metal gaps 306 and 308 between them. When casing material fills in metal gaps 302, 304, 306, 308, wide paths and/or path segments are created that can improve adhesion between casing 212 and lead frame 214 and improve the overall structural integrity/strength of package 200. The anode and cathode parts may also contain features such as indentations 314, through-holes 312, or cuts such as V-cuts 310. The metal gaps 302, 304, 306, 308, through-holes 312, indentations 314, cuts 310, bent leads, and/or other such features of the lead frame cooperate with the casing and/or fill material/encapsulant, at least in part, to enhance the structural stability and integrity of the package 200. The casing material and/or fill material/encapsulant extends at least partially into and/or through such features of the lead frame to add robustness. Without these types of features for improving the structural integrity of the package, packages can be damaged or deformed during fabrication and/or the lead frame and casing can dissociate during package operation.

Figure 17:
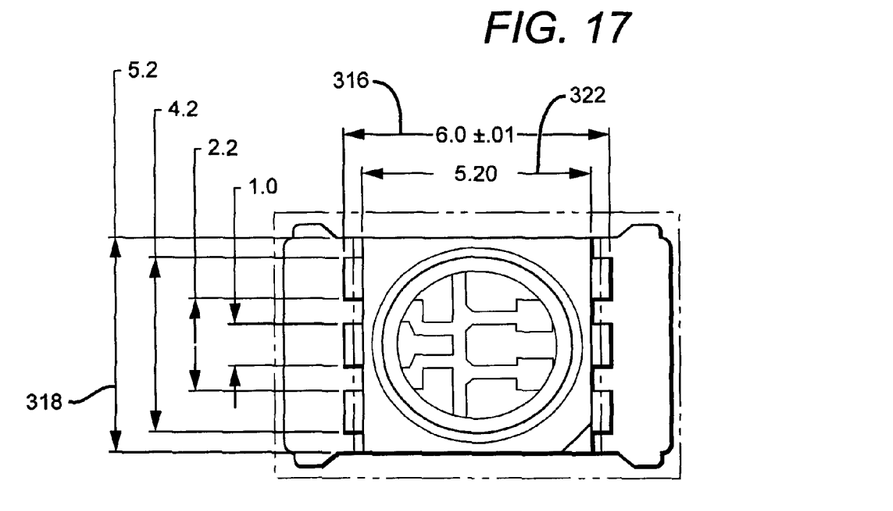
FIG. 17 is a top dimensional view of the embodiment shown in FIG. 11.

With reference now to FIGS. 17-18, some examples of dimensional characteristics of the various components of emitter package 200 are shown. By way of example and not limitation, the package 200 may have an overall length 316 of 6.0+/−0.1 mm, an overall width 318 of ~5.2 mm, and a height 320 of 1.30+/−0.05 mm. In other embodiments, the length may be less than 6.0 mm, less than 7.0 mm, or greater than 6.0 mm. The overall width may be less than 5.20 mm, less than 6.0 mm, or greater than 5.20 mm. The top portion 215 of the casing 212 may have an overall. length 322 of ~5.20 mm, less than 6.0 mm, less than 5.20 mm, or greater than 5.20 mm. The bottom portion 213 of the casing 212 may have an overall length greater than 5.20 mm but less than or equal to 6.0 mm, or may be otherwise dimensionally larger than the top portion 215. The width of the top portion 215 may be less than, equal to, or greater than that of bottom portion 213. According to possible embodiments for a thin/low profile emitter package 200, the height/thinness of the package may range from 1.0-1.35 mm, may be less than 1.35 mm, may be greater than 1.30 mm, may be less than 1.8 mm, or may be less than 2.0 mm.

Figure 21A:
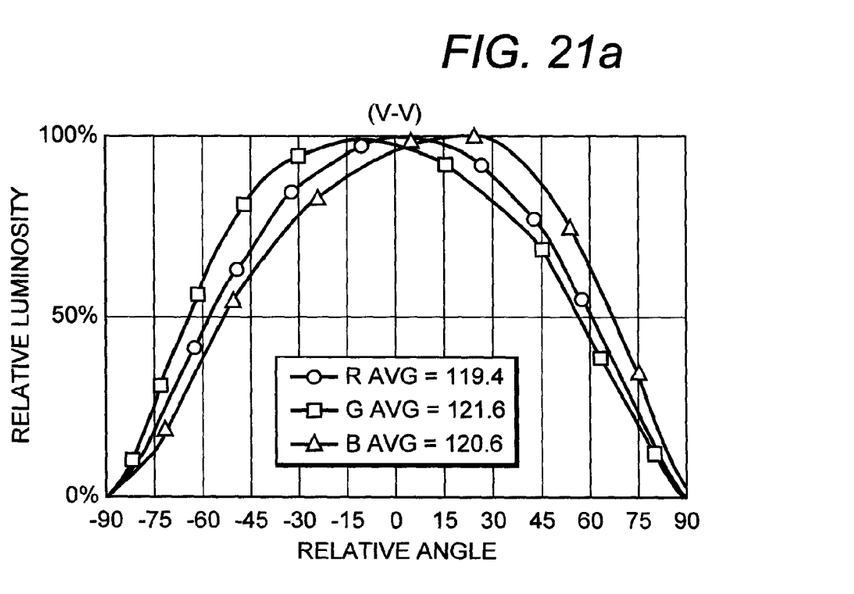
FIG. 21a is a graph illustrating V-V emission paths of the surface mount device embodiment shown in FIG. 1.
Figure 21B:
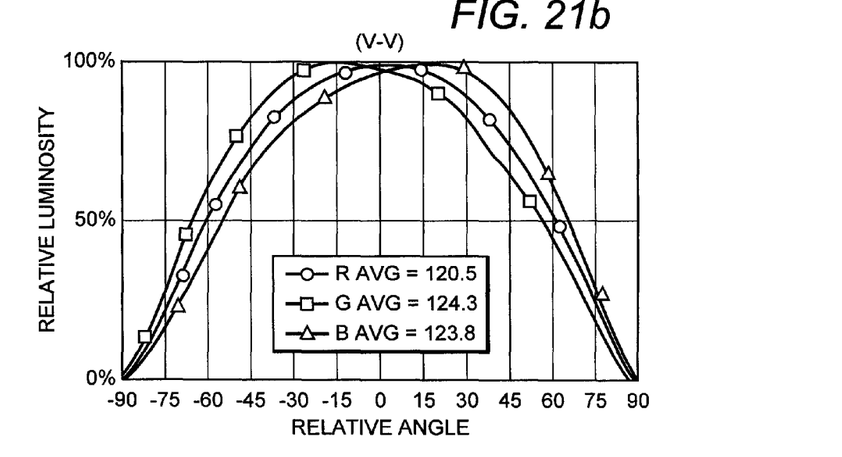
FIG. 21b is a graph illustrating V-V emission paths of the surface mount device embodiment shown in FIG. 11.

With reference to FIGS. 19a-21b, graphs are shown illustrating the relative luminosity of the various color LED chips as mounted in vertical, linear alignment in emitter packages according to the present invention. FIGS. 20a and 20b depict the relative luminosity of blue, red, and green LED chips according to horizontal viewing angles. FIGS. 21a and 21b depict the relative luminosity of blue, red, and green LED chips according to vertical viewing angles. While these figures indicate possible viewing angle results for packages according to the present invention, it is understood that other results may be achieved, such as if the LED chips are aligned linearly in horizontal configuration.

In an LED display according to the present invention, a driver PCB may be provided, upon which a large number of SMDs according to the present invention may be mounted. The SMDs may be arranged in rows and columns, with each SMD defining a pixel. The SMDs may comprise emitter packages such as those embodied by packages 10 and 200. The SMDs may be electrically connected to traces or pads on a PCB, with the PCB connected to respond to appropriate electrical signal processing and driver circuitry. As disclosed above, each of the SMDs carries a vertically oriented, linear array of blue, red and green LEDs. Such a linear orientation of the LEDs has been found to improve color fidelity over a wide range of viewing angles. However, it is understood that each SMD may alternatively carry a horizontally oriented, linear array of blue, red, and green LEDs. The LEDs may be arranged in any linear order, and less than or more than three LEDs in any desired color combination may be provided in accordance with the present invention.

While several illustrative embodiments of the invention have been shown and described, numerous variations and alternate embodiments will occur to those skilled in the art, such as utilizing the present invention for LED decorative lighting or the like. Such variations and alternate embodiments are contemplated, and can be made without departing from the spirit and scope of the invention as defined in the appended claims.

We claim:

1. An emitter package, comprising:
   a casing comprising a cavity extending into the interior of said casing from a top surface of said casing, wherein said casing comprises a stepwise gradation such that the length and width of the bottom of said casing are greater than the length and width of the top of said casing;
   an electrically conductive lead frame integral to said casing, wherein said lead frame comprises features that cooperate with said casing to provide a rigid connection between said lead frame and said casing; and
   a plurality of light emitting devices arranged on conductive parts of said lead frame, said light emitting devices and portions of said lead frame exposed through said cavity;
   wherein the bottom of said cavity comprises a different shape than the top of said cavity, with the shape of said cavity bottom increasing the surface area of said exposed lead frame portions.

2. The emitter package of claim 1, wherein said lead frame further comprises:
   a plurality of electrically conductive cathode parts each carrying at least one of said light emitting devices; and
   a corresponding plurality of electrically conductive anode parts separate from said cathode parts, each of said anode parts electrically connected to one of said light emitting devices.

3. The emitter package of claim 1, wherein said light emitting devices comprise LEDs arranged in linear alignment.

4. The emitter package of claim 1, wherein said light emitting devices are adapted to be energized to produce, in combination, a substantially full range of colors.

5. The emitter package of claim 2, wherein each of said light emitting devices comprises at least two contacts, one of which is electrically coupled to at least one of said cathode parts, and the other of which is electrically coupled to at least one of said anode parts.

6. The emitter package of claim 2, wherein:
   said light emitting devices are arranged in a linear array extending in a first direction;
   said anode parts are in a parallel relationship with each other; and
   said cathode parts are in parallel relationship with each other;
   wherein said anode and cathode parts extend in a second direction orthogonal to said first direction.

7. The emitter package of claim 1, wherein said lead frame is comprised of copper or a copper alloy.

8. The emitter package of claim 3, wherein said LEDs comprise red, green, and blue LEDs.

9. The emitter package of claim 2, wherein each of said light emitting devices is attached to a respective cathode part via a wire bond and a respective anode part via solder.

10. The emitter package of claim 1, wherein said casing is comprised of a plastic or resin.

11. The emitter package of claim 1, wherein said features comprise one or more of: through-holes, cuts, bent leads, side indentations, side tabs, or metal gaps between adjacent portions of said lead frame, with said casing encompassing said features to enhance the adhesion between said casing and said lead frame compared to packages not comprising said features.

12. The emitter package of claim 8, wherein said LEDs are in vertical alignment.

13. The emitter package of claim 1, wherein said cavity further comprises a depth less than or equal to 0.5 mm, with said depth increasing the viewing angle.

14. The emitter package of claim 1, further comprising a UV resistant encapsulant over said package.

15. The emitter package of claim 14, wherein said encapsulant comprises silicone.

16. The emitter package of claim 14, wherein the top of said encapsulant is substantially flat.

17. The emitter package of claim 1, wherein said cavity is at least partially filled with a fill material.

18. The emitter package of claim 1, wherein the shape of said cavity bottom is defined by four arcs, and the shape of the top of said cavity is circular.

19. The emitter package of claim 1, wherein said cavity comprises a reflector.

20. The emitter package of claim 1, wherein the height of said package is between 0.9-1.0 mm.

21. The emitter package of claim 1, wherein the height of said package is less than 1.3 mm.

22. The emitter package of claim 1, further comprising one or more Zener diodes electrically connected to said exposed lead frame portions.

23. An emitter package, comprising:
   a casing comprising a cavity extending into the interior of said casing from a top surface of said casing;
   a lead frame integral to said casing, wherein said lead frame comprises features that cooperate with said casing to provide a rigid connection between said lead frame and said casing; and
   a plurality of light emitting devices arranged on portions of said lead frame exposed through said cavity;

wherein said casing comprises a stepwise gradation such that the length and width of the bottom of said casing are greater than the length and width of the top of said casing.

24. The emitter package of claim 23, further comprising one or more Zener diodes electrically connected to said exposed lead frame portions.

25. The emitter package of claim 23, wherein said lead frame further comprises:
a plurality of electrically conductive cathode parts each carrying at least one of said light emitting devices; and
a corresponding plurality of electrically conductive anode parts separate from said cathode parts, each of said anode parts electrically connected to one of said light emitting devices;
wherein each of said light emitting devices is attached to a respective cathode part via a wire bond, and each of said light emitting devices is attached to a respective anode part via solder.

26. The emitter package of claim 23, wherein said light emitting devices comprise red, green, and blue LEDs arranged in linear alignment, said LEDs adapted to be energized to produce, in combination, a substantially full range of colors.

27. The emitter package of claim 23, wherein said features comprise one or more of: through-holes, cuts, bent leads, side indentations, side tabs, or metal gaps between adjacent portions of said lead frame, said casing encompassing said features to enhance the adhesion between said casing and said lead frame compared to packages not comprising said features.

28. The emitter package of claim 23, wherein the depth of said cavity is less than or equal to 0.5 mm, said depth increasing the viewing angle.

29. The emitter package of claim 23, further comprising a silicone encapsulant over said package, with the top of said encapsulant being substantially flat.

30. The emitter package of claim 23, wherein said cavity is at least partially filled with a fill material.

31. The emitter package of claim 23, wherein said cavity comprises a reflector.

32. The emitter package of claim 23, wherein the height of said package is between 1.25-1.35 mm.

33. The emitter package of claim 23, wherein the height of said package is less than 1.8 mm.

34. The emitter package of claim 23, wherein the size of the bottom of said casing is standardized for attachment to a printed circuit board, while the size of the top of said casing is customizable for a variety of desired applications.

35. A low profile emitter package, comprising:
a casing comprising a cavity extending into the interior of said casing from a top surface of said casing, wherein said casing comprises a stepwise gradation such that the length and width of the bottom of said casing are greater than the length and width of the top of said casing;
a lead frame integral to said casing, wherein said lead frame comprises features that cooperate with said casing to provide a rigid connection between said lead frame and said casing; and
a plurality of LEDs arranged in linear alignment on said lead frame, said LEDs and portions of said lead frame exposed through said cavity;
wherein the height of said package is between 0.9 to 1.35 mm.

36. The low profile emitter package of claim 35, wherein the bottom of said cavity comprises a different shape than the top of said cavity, with the shape of said cavity bottom increasing the surface area of said exposed lead frame portions.

37. The low profile package of claim 36, wherein said features comprise one or more of: through-holes, cuts, bent leads, side indentations, side tabs, and metal gaps between adjacent portions of said lead frame, said casing encompassing said features to enhance the adhesion between said casing and said lead frame compared to packages not comprising said features.

38. A light emitting device display, comprising:
a substrate carrying an array of emitter packages, each of said emitter packages comprising:
a casing comprising a cavity extending into the interior of said casing from a top surface of said casing, wherein said cavity has a depth of less than or equal to 0.5 mm, wherein said casing comprises a stepwise gradation such that the length and width of the bottom of said casing are greater than the length and width of the top of said casing;
a lead frame integral to said casing, wherein said lead frame comprises features that cooperate with said casing to provide a rigid connection between said lead frame and said casing; and
a plurality of LEDs arranged in linear alignment on said lead frame, said LEDs and portions of said lead frame exposed through said cavity; and
electrically connected drive circuitry to selectively energize said array for producing visual images on said display.

39. The display of claim 38, wherein each of said LEDs in said emitter packages is driven by a respective electrical signal, each of said LEDs further defining one pixel of said display.

40. The display of claim 38, wherein said LEDs in at least some of said emitter packages are vertically aligned.

41. The display of claim 38, wherein each of said emitter packages has a height ranging from 0.9 to 1.35 mm.

* * * * *